United States Patent
Wang et al.

(10) Patent No.: US 12,224,377 B2
(45) Date of Patent: Feb. 11, 2025

(54) MICRO-SIZED FACE-UP LED DEVICE WITH MICRO-HOLE ARRAY AND PREPARATION METHOD THEREOF

(71) Applicants: SOUTH CHINA UNIVERSITY OF TECHNOLOGY, Guangzhou (CN); ZHONGSHAN INSTITUTE OF MODERN INDUSTRIAL TECHNOLOGY, SOUTH CHINA UNIVERSITY OF TECHNOLOGY, Guangdong (CN)

(72) Inventors: Hong Wang, Guangzhou (CN); Lijun Tan, Guangzhou (CN); Ruohe Yao, Guangzhou (CN); Kai Wang, Guangzhou (CN); Zijing Xie, Guangzhou (CN)

(73) Assignees: SOUTH CHINA UNIVERSITY OF TECHNOLOGY, Guangzhou (CN); ZHONGSHAN INSTITUTE OF MODERN INDUSTRIAL TECHNOLOGY, SOUTH CHINA UNIVERSITY OF TECHNOLOGY, Guangdong (CN)

( * ) Notice: Subject to any disclaimer, the term of this patent is extended or adjusted under 35 U.S.C. 154(b) by 524 days.

(21) Appl. No.: 17/695,873

(22) Filed: Mar. 16, 2022

(65) Prior Publication Data
US 2022/0209065 A1 Jun. 30, 2022

Related U.S. Application Data

(63) Continuation of application No. PCT/CN2020/124571, filed on Oct. 29, 2020.

(30) Foreign Application Priority Data

Jul. 29, 2020 (CN) .......................... 202010746592.7

(51) Int. Cl.
H01L 33/00 (2010.01)
H01L 33/06 (2010.01)
(Continued)

(52) U.S. Cl.
CPC .......... *H01L 33/24* (2013.01); *H01L 33/0075* (2013.01); *H01L 33/06* (2013.01);
(Continued)

(58) Field of Classification Search
CPC ..... H01L 33/24; H01L 33/0075; H01L 33/06; H01L 33/32; H01L 33/38; H01L 33/40;
(Continued)

(56) References Cited

U.S. PATENT DOCUMENTS 10,607,974 B2 * 3/2020 Fan ........................ H01L 33/58
2021/0193871 A1 * 6/2021 Wong ...................... H01L 33/44

* cited by examiner

*Primary Examiner* — Tan N Tran
(74) *Attorney, Agent, or Firm* — JCIPRNET

(57) ABSTRACT

The present invention discloses a micro-sized face-up LED device with a micro-hole array and preparation method thereof. The LED device is prepared based on a GaN-based epitaxial layer and includes a GaN-based epitaxial layer, a current spreading layer, a P electrode, an N electrode and a passivation layer; the GaN-based epitaxial layer including a substrate, an N-type CaN layer, i.e., an N-GaN layer, a multiple quantum well layer (MQW), and a P-type GaN layer, i.e., a P-GaN layer; and the N-GaN layer including an etched exposed N-GaN layer and an etched formed N-GaN layer. The present invention improves luminescence efficiency while ensuring the device modulation bandwidth; and after the micro-hole array is etched by ICP, a sample continues to be etched by using the current spreading layer etching liquid to prevent the leakage caused by the expansion of the current spreading layer in the etching process.

9 Claims, 4 Drawing Sheets

(51) Int. Cl.
  *H01L 33/24* (2010.01)
  *H01L 33/32* (2010.01)
  *H01L 33/38* (2010.01)
  *H01L 33/40* (2010.01)
  *H01L 33/44* (2010.01)
(52) U.S. Cl.
  CPC .............. *H01L 33/32* (2013.01); *H01L 33/38* (2013.01); *H01L 33/40* (2013.01); *H01L 33/44* (2013.01); *H01L 2933/0016* (2013.01); *H01L 2933/0025* (2013.01)
(58) Field of Classification Search
  CPC ............. H01L 33/44; H01L 2933/0016; H01L 2933/0025; H01L 33/20; H01L 33/007; H01L 33/14
  USPC .................................................. 257/13, 98
  See application file for complete search history.

MICRO-SIZED FACE-UP LED DEVICE WITH MICRO-HOLE ARRAY AND PREPARATION METHOD THEREOF

CROSS-REFERENCE TO RELATED APPLICATION

This application is a continuation of international PCT application serial no. PCT/CN2020/124571, filed on Oct. 29, 2020, which claims the priority benefit of China application no. 202010746592.7, filed on Jul. 29, 2020. The entirety of each of the above-mentioned patent applications is hereby incorporated by reference herein and made a part of this specification.

TECHNICAL FIELD

The present invention relates to the technical field of LED devices for visible light communication, in particular to a micro-sized face-up LED device with a micro-hole array and a preparation method thereof.

BACKGROUND

Compared with traditional light sources, LED devices not only have high luminous efficiency and long life, but also have good modulation performance and high modulation bandwidth. Based on the above advantages of the LED devices, a signal can be modulated to the visible light emitted by the LED devices for transmission, and the visible light wireless communication can be realized while considering lighting. The modulation bandwidth of LEDs is mainly affected by minority carrier recombination lifetime in an active region and RC time constant, where R and C are equivalent resistance and equivalent capacitance of the LED devices, respectively. Reducing an area of the active region of the LED devices is to achieve a micro-sized LED, on the one hand, it can effectively reduce the equivalent capacitance, thereby reducing the RC time constant; on the other hand, it can improve the current per unit area of the LED devices, reduce the recombination life of minority carriers in the active region, and finally improve the modulation bandwidth of devices. At present, in order to improve the minority carrier recombination lifetime in the active region, the commonly used methods are resonant cavity, surface plasmon and photonic crystal technology. For a normal face-up LED, a distance between ITO and Mesa is not an effective luminescent region, so the device performance can be improved by using this part of region effectively (Yang C C, Lin C F, et al. (2009). Journal of the Electronic Society 156 (5): H316-H319).

SUMMARY

The present invention is directed to GaN-based micro-sized LED devices, and discloses a micro-sized face-up device structure with a micro-hole array and a preparation method thereof, which can effectively improve a light extraction efficiency.

The object of the present invention is realized by at least one of the following technical solutions.

The present invention discloses a micro-sized face-up LED device with a micro-hole array, which is prepared based on a GaN-based epitaxial layer and includes a GaN-based epitaxial layer, a current spreading layer, a P electrode, an N electrode and a passivation layer; the GaN-based epitaxial layer including a substrate, an N-type CaN layer, i.e., an N-GaN layer, a multiple quantum well layer (MQW), and a P-type GaN layer, i.e., a P-GaN layer; and the N-GaN layer including an etched exposed N-GaN layer and an etched formed N-GaN layer;

wherein an upper surface of the substrate is connected to a lower surface of the etched exposed N-GaN layer; a part of an upper surface of the etched exposed N-GaN layer is connected to the etched formed N-GaN layer and a part thereof is connected to the N electrode; an upper surface of the etched formed N-GaN layer is connected to a lower surface of the multiple quantum well layer; an upper surface of the multiple quantum well layer is connected to a lower surface of the P-GaN layer; an upper surface of the P-GaN layer is connected to a lower surface of the current spreading layer, and the current spreading layer is disposed at a center of the upper surface of the P-GaN layer; an upper surface of the current spreading layer is connected to the P electrode, and the P electrode is disposed at a center of the upper surface of the current spreading layer; the passivation layer covers the whole device except the P electrode and N electrode; the P-GaN layer, the multiple quantum well layer and the etched formed N-GaN layer from top to bottom constitute a Mesa, i.e., a luminescent region, and the Mesa is prepared with micro-holes in partial regions from an edge of the mesa to a center direction.

Further, the P electrode is in a double ring shape with a straight line is connecting two rings in the middle; the current spreading layer has a cylindrical structure with a bottom radius smaller than a bottom radius of the P-GaN layer, and the current spreading layer is a metal doped current spreading layer, including an ohmic contact layer disposed at a bottom of the current spreading layer and forms good ohmic contact with the P-GaN layer and a metal doped current transport layer; the N electrode is annular, an inner ring and an outer ring of the N electrode are round, and an inward and outward semicircular bulge is additionally arranged on the basis, and a diameter of the protrusion is 5 μm to 15 μm; and the N electrode and the P electrode adopt a four-layer metal alloy composed of metals of Ni, Cr, Ti, Ag, Al, and Au, with a thickness of 1 μm to 1.25 μm.

Further, the Mesa is made from a semiconductor material; the Mesa, i.e., the luminescent region is of a cylindrical structure with a bottom radius of 30 μm to 160 μm; the Mesa is prepared with micro-holes in partial regions from an edge of the mesa to a center direction of the device, the micro-holes are distributed in a circular array on the Mesa, near the edge of the Mesa but not in contact with the edge.

Further, the micro-holes are distributed in a middle area between the edge of the current spreading layer and the edge of the Mesa or in the partial regions of the edge of the Mesa to the center direction of the device, including the middle area between the edge of the current spreading layer and the edge of the Mesa and an area extending, by 0 μm to 10 μm, toward a center of the current spreading layer.

Further, the micro-holes have a shape of one of a circle, a triangle, a square or a hexagon; when the micro-holes are circle, the micro-holes have a micron size and a diameter of 1 μm to 8 μm; and when the micro-holes are triangular, square or hexagonal, an inscribed circle diameter of the micro-holes is 1 μm to 8 μm; and depths of the micro-holes are adjustable from 100 nm to 1400 nm; the micro-holes are formed by etching down from a topmost layer of the device, which is one of deep etching to the current spreading layer, etching to the P-GaN layer, etching to the multiple quantum well layer and etching to the N-GaN layer; and the passivation layer is deposited on inner side wall surfaces of the micro-holes.

Further, an area covered by the passivation layer includes the current spreading layer, the P-GaN layer, the multiple quantum well layer, a side wall of the etched formed N-GaN layer, surfaces of the current spreading layer and the etched exposed N-GaN layer, and internal side walls of the micro-holes; the passivation layer is $SiO_2$ and has a thickness of one-quarter optical wavelength to remove a refractive index of a passivation material; the passivation layer may also be a $HfO_2/MgO$ double-layer passivation layer with a first passivation layer being $HfO_2$ and a second passivation layer being MgO.

A method of preparing a micron-sized face-up LED device with a micro-hole array includes the following steps:

S1, evaporating Al-doped indium tin oxide on a GaN-based epitaxial layer by using electron beam evaporation coating technology, performing an annealing treatment by using rapid thermal annealing technology subsequently, and then using a photoresist coated with tackifier as a mask layer, soaking in a current spreading layer etching liquid to form a cylindrical Al-doped indium tin oxide (ITO) layer, i.e., a current spreading layer, with a bottom radius smaller than a P-GaN layer and positioned in a central area of a surface of the P-GaN layer, and then removing the photoresist;

S2, forming a photoresist mask layer coated with the tackifier by using a mask with a Mesa structure in combination with photolithography, and transferring the Mesa structure to the GaN-based epitaxial layer by ICP etching technology until an etched exposed N-GaN layer is exposed, and then removing the photoresist;

S3, forming the photoresist mask layer coated with the tackifier by using a mask with a micro-hole array structure in conjunction with an ordinary ultraviolet lithography, soaking in the current spreading layer etching liquid, then transferring the micro-hole array structure to the GaN-based epitaxial layer by the ICP etching technology, wherein depths of micro-holes are adjustable as needed, then baking on a hot plate at 95° C.-125° C. for 3 minutes to 5 minutes, then soaking in the current spreading layer etching liquid for 1 minute to 5 minutes as a post-treatment of the Al-doped indium tin oxide, and then removing the photoresist;

S4, growing a passivation layer by using a passivation layer deposition technology, forming the photoresist mask layer coated with the tackifier in conjunction with the photolithography, the mask layer having openings at a top central area of the current spreading layer and an etched exposed N-GaN layer region exposed by etching the Mesa structure, etching the top central area of the current spreading layer and the etched exposed N-GaN layer region exposed by etching the Mesa structure by the ICP etching technology until the passivation layer is completely removed, and then removing the photoresist; and S5. preparing a metal using a negative photoresist and the electron beam evaporation technology, and preparing the P electrode and the N electrode at an exposed top center area of the current spreading layer and the etched exposed N-GaN layer region exposed by etching the Mesa structure, respectively, in conjunction with a metal lift-off technology.

Further, step S1 includes the following steps:

S1.1, using the electron beam evaporation technology to evaporate an ITO layer used as an ohmic contact layer at 25° C. to 35° C. under a vacuum condition without oxygen; then introducing 2 sccm to 6 sccm oxygen continuously, and evaporating an ITO layer used as an Al-doped current transport layer, a ratio of the ITO layer used as an ohmic contact layer and the ITO layer used as an Al-doped current transport layer being 1:5 to 1:10, and a total thickness of the ITO layers being 100 nm to 230 nm;

S1.2, on the basis of step S1.1, stopping introducing oxygen and continuing the evaporation of Al metal under a vacuum atmosphere, the Al metal having a thickness of 1 nm to 5 nm; and S1.3, taking out samples in an electron beam evaporation equipment after steps S1.1 and S1.2, and performing annealing treatment in a rapid thermal annealing furnace, i.e., continuously introducing nitrogen and oxygen with a ratio of 200 sccm:30 sccm to 200 sccm:50 sccm to perform annealing under a pure nitrogen environment, with an annealing temperature of 500° C. to 600° C. and an annealing treatment time of 3 minutes to 6 minutes; forming an Al-doped ITO current spreading film after the annealing treatment was completed, with a bottom layer as the ITO layer of the ohmic contact layer and a top layer as the ITO layer of the Al-doped current transport layer.

Further, in step S3, the micro-holes on the mask with the micro-hole array structure are distributed in a middle area between the edge of the current spreading layer and the edge of the Mesa or in the partial regions of the edge of the Mesa to the center direction of the device, including the middle area between the edge of the current spreading layer and the edge of the Mesa and an area extending, by 0 μm to 10 μm, toward a center of the current spreading layer; the micro-holes have a shape of one of a circle, a triangle, a square or a hexagon; when the micro-holes are circle, the micro-holes have a micron size; and when the micro-holes are triangular, square or hexagonal, an inscribed circle diameter of the micro-holes is micron; and depths of the micro-holes are adjustable as needed from 100 nm to 1400 nm; the micro-holes are formed by etching down from a topmost layer of the device, which is one of deep etching to the current spreading layer, etching to the P-GaN layer, etching to the multiple quantum well layer and etching to the N-GaN layer.

Further, in step S3, the mask with the micro-hole array structure can be replaced by a mask with a nano-hole array structure, and the corresponding ordinary ultraviolet lithography needs to be replaced by the electron beam lithography; the nano-hole is round and has a diameter of 50 nm to 1000 nm; the nano-hole is distributed in a middle area between the edge of the current spreading layer and the edge of the Mesa or in the partial regions of the edge of the Mesa to the center direction of the device, including the middle area between the edge of the current spreading layer and the edge of the Mesa and an area extending, by 0 μm to 10 μm, toward a center of the current spreading layer; a depth of the nano-hole is adjustable as needed from 100 nm to 1400 nm, which is formed by etching down from the topmost layer of the device, and is one of deep etching to the current spreading layer, etching to the P-GaN layer, etching to the multiple quantum well layer and etching to the N-GaN layer.

Further, the step S2 and the step S3 can be combined, and the mask with the Mesa structure in step S2 and the mask with the micro-hole array structure in step S3 can be replaced by the mask with both the Mesa structure and the micro-hole array structure, and the specific operation is as follows:

forming the photoresist mask layer coated with the tackifier by using the mask with both the Mesa structure and the micro-hole array structure in conjunction with an ordinary ultraviolet lithography, soaking in the current spreading layer etching liquid, then transferring the Mesa structure and the micro-hole array structure to the GaN-based epitaxial layer by the ICP etching technology until the etched exposed N-GaN layer is exposed, and a height of the micro-hole being the same as a height of the Mesa, then baking on a hot plate at 95° C. to 125° C. for 3 minutes to 5 minutes, then soaking in the current spreading layer etching liquid for 1 minute to 5 minutes as a post-treatment of the Al-doped indium tin oxide, and then removing the photoresist.

Compared with the prior art, the present invention has the following advantages and beneficial effects:

1) with the micro-sized face-up LED device with a micro-hole array prepared in the present invention, the micro-hole array is prepared on the micro-sized device, which improves luminescence efficiency while ensuring the device modulation bandwidth;
2) with the micro-sized face-up LED device with the micro-hole array prepared by the present invention, the height of the micro-hole array can be adjusted as needed, so that the luminance efficiency can be improved in different degrees;
3) with the micro-sized face-up LED device with the micro-hole array prepared by the present invention, the passivation layer with a refractive index smaller than that of the GaN semiconductor material is prepared in the micro-hole, which increase the light extraction efficiency while protecting the device from leakage; and
4) in the method of preparing a micro-sized face-up LED device with a micro-hole array of the present invention, after the micro-hole array is etched by ICP in step S3, the sample is continuously etched by using the current spreading layer etching liquid, so as to prevent the leakage caused by the expansion of the current spreading layer in the etching process.

DETAILED DESCRIPTION OF EMBODIMENTS

The detailed description of the present invention is further described below in conjunction with the accompanying drawings and examples, but the implementation and the protection of the present invention are not limited thereto. It should be noted that any process or parameter not specifically described in detail below can be achieved by those skilled in the art with reference to the prior art.

Figure 1:
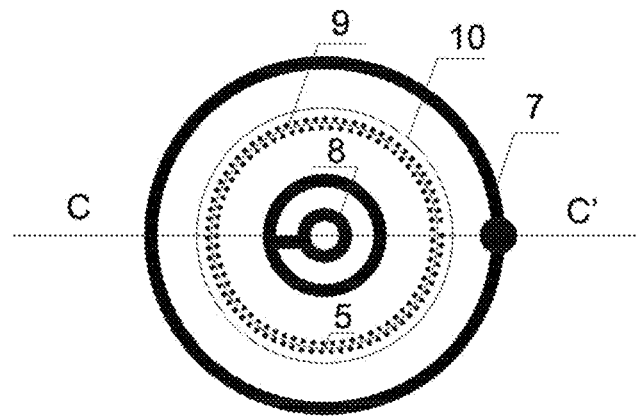
FIG. 1 is a schematic top view of a micro-sized face-up LED device with a micro-hole array in embodiments 1 and 2.
Figure 2:
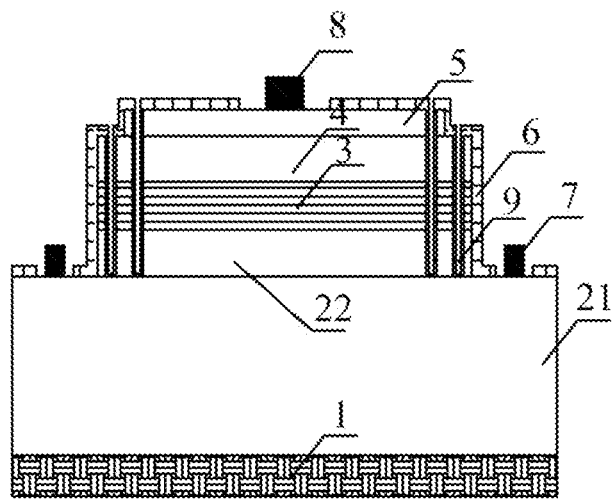
FIG. 2 is a schematic cross-sectional view of the micro-sized face-up LED device with the micro-hole array in embodiments 1 and 2 taken at a section line CC'.

A micro-sized face-up LED device with a micro-hole array, as shown in FIGS. 1 and 2, is prepared based on a GaN-based epitaxial layer and includes a GaN-based epitaxial layer, a current spreading layer 5, a P electrode 8, an N electrode 7 and a passivation layer 6; the GaN-based epitaxial layer including a substrate 1, an N-type CaN layer, i.e., an N-GaN layer 2, a multiple quantum well layer (MQW) 3, and a P-type GaN layer, i.e., a P-GaN layer 4; and the N-GaN layer 2 including an etched exposed N-GaN layer 21 and an etched formed N-GaN layer 22, wherein an upper surface of the substrate 1 is connected to a lower surface of the etched exposed N-GaN layer 21; an upper surface of the etched exposed N-GaN layer 21 is partially connected to the etched formed N-GaN layer 22 and partially connected to the N electrode 7; an upper surface of the etched formed N-GaN layer 22 is connected to a lower surface of the multiple quantum well layer 3; an upper surface of the multiple quantum well layer 3 is connected to a lower surface of the P-GaN layer 2; an upper surface of the P-GaN layer 4 is connected to a lower surface of the current spreading layer 5, and the current spreading layer 5 is disposed at a center of the upper surface of the P-GaN layer 4; an upper surface of the current spreading layer 5 is connected to the P electrode 8, and the P electrode 8 is disposed at a center of the upper surface of the current spreading layer 5; the passivation layer 6 covers the whole device except the P electrode 8 and N electrode 7; the P-GaN layer 4, the multiple quantum well layer 3 and the etched formed N-GaN layer 22 from top to bottom constitute a Mesa 10, i.e., a luminescent region, and the Mesa 10 is prepared with micro-holes 9 in partial regions from an edge of the mesa to a center direction.

Embodiment 1

Figure 3A:
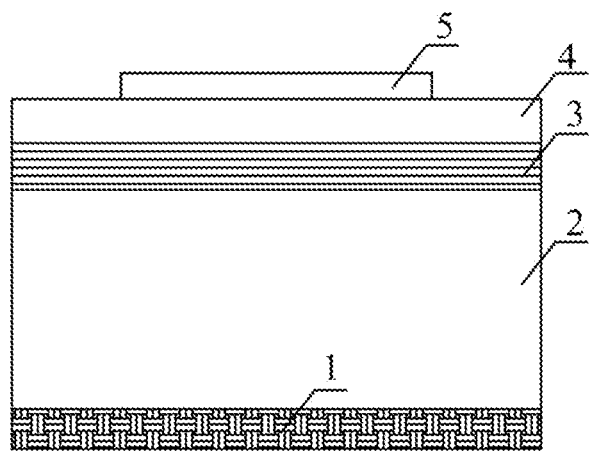
FIG. 3a is a schematic cross-sectional view of preparing a current spreading layer for the micro-sized face-up LED device with the micro-hole array in embodiment 1.
Figure 3B:
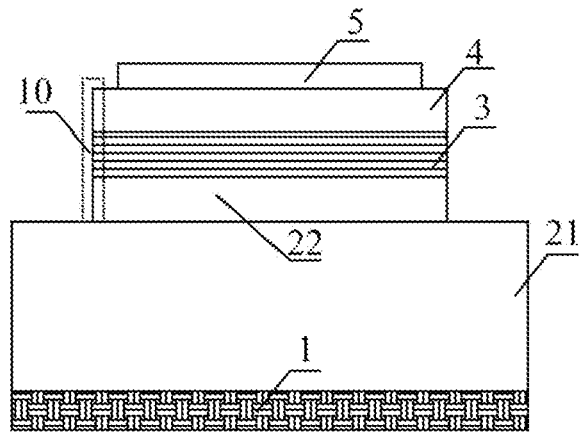
FIG. 3b is a schematic cross-sectional view of preparing a Mesa for the micro-sized face-up LED device with the micro-hole array in embodiment 1.
Figure 3C:
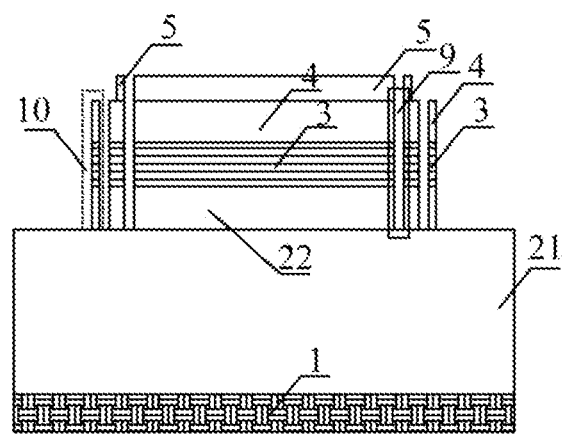
FIG. 3c is a schematic cross-sectional view of preparing a micro-hole array structure for the micro-sized face-up LED device with the micro-hole array in embodiment 1.
Figure 3D:
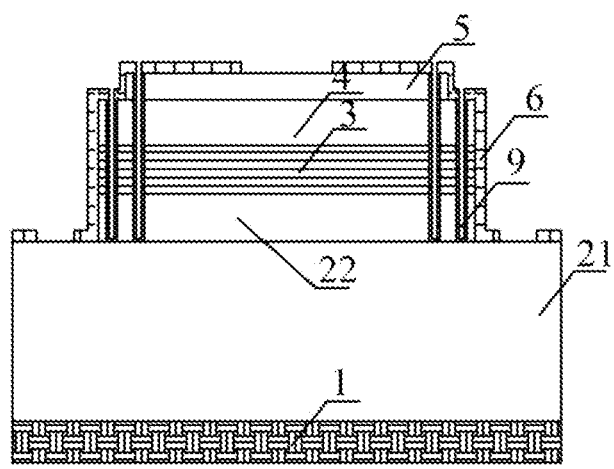
FIG. 3d is a schematic cross-sectional view of preparing a passivation layer for the micro-sized face-up LED device with the micro-hole array in embodiment 1.
Figure 3E:
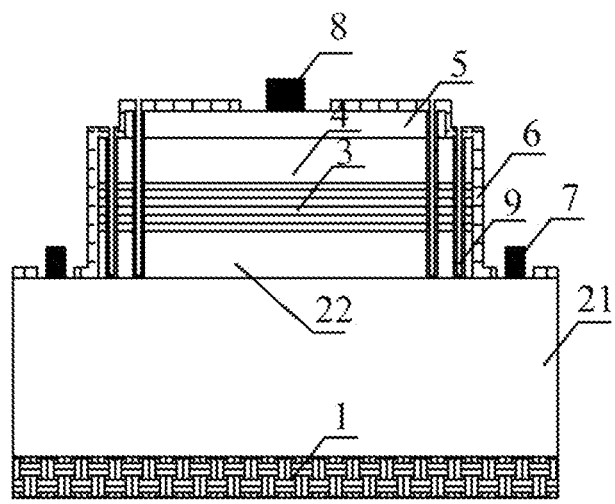
FIG. 3e is a schematic cross-sectional view of preparing electrodes for the micro-sized face-up LED device with the micro-hole array in embodiment 1.

In this embodiment, the preparation of the micro-sized face-up LED device with a micro-hole array are as follows:
A1, evaporating Al-doped indium tin oxide on the GaN-based epitaxial layer by using an electron beam evaporation coating technology, with a total thickness of 233 nm, wherein a thickness of ITO is 230 nm and a thickness of Al is 3 nm; performing an annealing treatment by using rapid thermal annealing technology subsequently, that is, in a pure nitrogen environment, introducing 200 sccm nitrogen and 40 sccm oxygen continuously, and performing the annealing treatment at 550° C. for 5 minutes; then using the photoresist coated with a tackifier as a mask layer, and soaking in a current spreading layer etching liquid, i.e., the ITO etching liquid at 35° C. for 22 minutes to form a cylindrical Al-doped indium tin oxide (ITO) layer with a bottom radius smaller than a P-GaN layer 2 and positioned in a central area of a surface of the P-GaN layer 2, i.e., a current spreading layer 5 with a radius of 45 and then removing the photoresist is removed by combining 85° C. glue removal solution and acetone, as shown in FIG. 3a;

A2, forming a photoresist mask layer coated with the tackifier by using a mask with a Mesa 10 structure in combination with photolithography, and transferring the Mesa 10 structure with a bottom radius of 45 µm to the GaN-based epitaxial layer by the ICP etching technology until an etched exposed N-GaN layer 21 is exposed, and then removing the photoresist, as shown in FIG. 3b;

A3, forming the photoresist mask layer coated with the tackifier by using a mask with a micro-hole 9 array structure in conjunction with an ordinary ultraviolet lithography, soaking in the current spreading layer etching liquid, i.e., ITO etching liquid at 35° C. for 22 minutes, then transferring the micro-hole 9 array structure to the GaN-based epitaxial layer by the ICP etching technology, wherein depths of micro-holes are adjustable as needed, a height of etching to the etching exposed N-GaN layer 21 is equal to a height of the Mesa 10, then baking on a hot plate at 105° C. for 3 minutes, then soaking in the current spreading layer etching liquid, i.e., the ITO etching liquid at 35° C. for 5 minutes as a post-treatment of the Al-doped indium tin oxide, and then removing the photoresist, as shown in FIG. 3c;

A4, growing a $SiO_2$ passivation layer 6 by using a plasma enhanced chemical vapor deposition technology, forming the photoresist mask layer coated with the tackifier in conjunction with the photolithography, the mask layer having openings at a top central area of the current spreading layer 5 and an etched exposed N-GaN layer 21 region exposed by etching the Mesa 10 structure, etching the $SiO_2$ passivation layer 6 of the top central area and the etched exposed N-GaN layer region by the ICP etching technology for 14 minutes until the $SiO_2$ passivation layer 6 is completely removed from the regions, and then removing the photoresist by using the acetone and the 85° C. glue removal solution, as shown in FIG. 3d;

A5. preparing a Cr/Al/Ti/Au metal with a thickness of 1.25 µm using a negative photoresist and the electron beam evaporation technology, and preparing the P electrode 8 and the N electrode 7 at an exposed top center area of the current spreading layer 5 and the etched exposed N-GaN layer 21 region exposed by etching the Mesa 10 structure, respectively, in conjunction with a metal lift-off technology, i.e., first soaking in the acetone at 60° C. for 10 minutes, followed by metal lift-off using a blue film, as shown in FIG. 3e.

As above, the micro-sized face-up LED device with micro-hole array can be better completed.

Embodiment 2

Figure 4A:
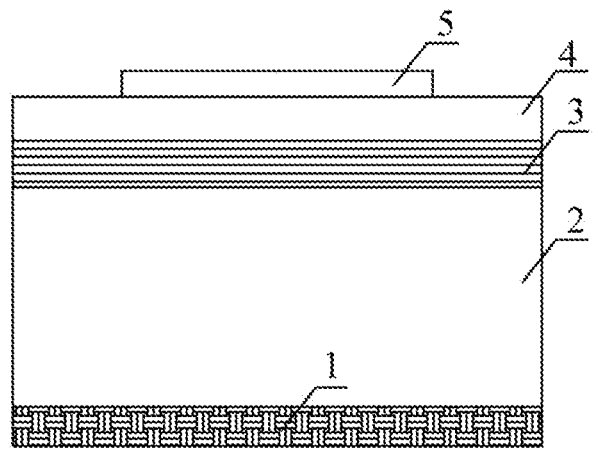
FIG. 4a is a schematic cross-sectional view of preparing a current spreading layer for the micro-sized face-up LED device with the micro-hole array in embodiment 2.
Figure 4B:
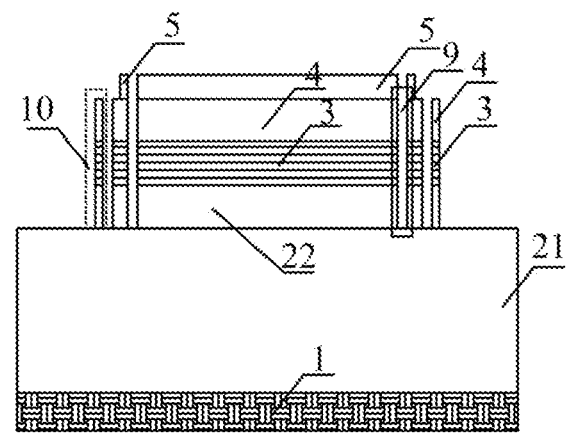
FIG. 4b is a schematic cross-sectional view of preparing a Mesa and a micro-hole array structure for the micro-sized face-up LED device with the micro-hole array in embodiment 2.
Figure 4C:
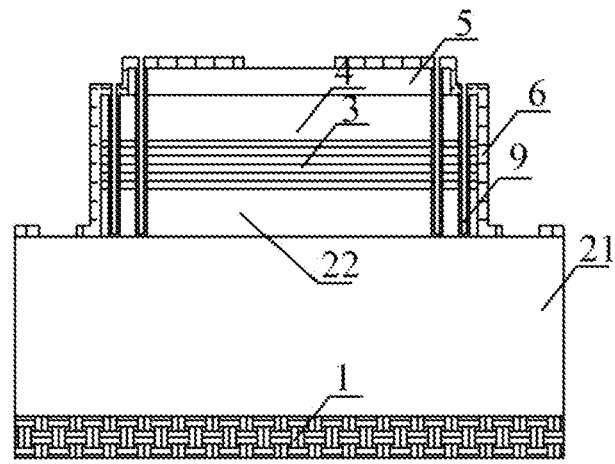
FIG. 4c is a schematic cross-sectional view of preparing a passivation layer for the micro-sized face-up LED device with the micro-hole array in embodiment 2.
Figure 4D:
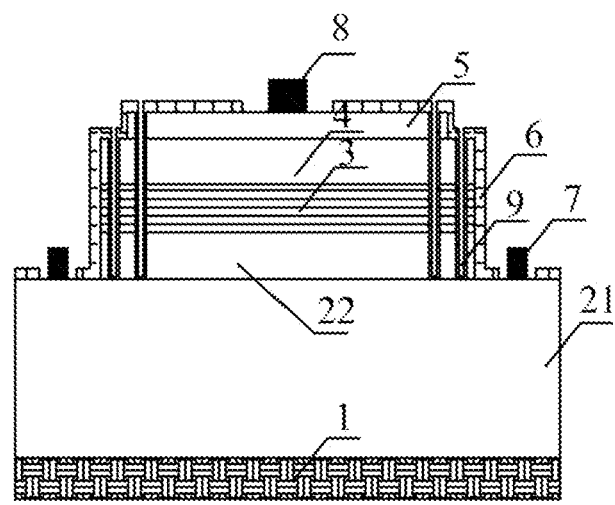
FIG. 4d is a schematic cross-sectional view of preparing electrodes for the micro-sized face-up LED device with the micro-hole array in embodiment 2.

In this embodiment, the preparation of the micro-sized face-up LED device with the micro-hole array are as follows:

B1, evaporating Al-doped indium tin oxide on the GaN-based epitaxial layer by using an electron beam evaporation coating technology, with a total thickness of 233 nm, wherein a thickness of ITO is 230 nm and a thickness of Al is 3 nm; then in a pure nitrogen environment, introducing 200 sccm nitrogen and 40 sccm oxygen continuously, and performing the annealing treatment at 550° C. for 5 minutes; then using the photoresist coated with a tackifier as a mask layer, and soaking in the ITO etching liquid at 35° C. for 22 minutes to form a cylindrical Al-doped indium tin oxide (ITO) layer with a bottom radius smaller than a P-GaN layer 2 and positioned in a central area of a surface of the P-GaN layer 2, i.e., a current spreading layer 5 with a radius of 45 µm, and then removing the photoresist is removed by combining 85° C. glue removal solution and acetone, as shown in FIG. 4a;

B2, forming the photoresist mask layer coated with the tackifier by using the mask with both the Mesa 10 structure and the micro-hole 9 array structure in conjunction with an ordinary ultraviolet lithography, soaking in the current spreading layer etching liquid, i.e., the ITO etching liquid at 35° C. for 22 minutes, then transferring the Mesa 10 structure with a bottom radius of 45 µm and the micro-hole 9 array structure to the GaN-based epitaxial layer by the ICP etching technology until the etched exposed N-GaN layer 21 is exposed, and a height of the micro-hole 9 being the same as a height of the Mesa 10, then baking on a hot plate at 105° C. for 3 minutes, then soaking in the current spreading layer etching liquid for 5 minute as a post-treatment of the Al-doped indium tin oxide, and then removing the photoresist, as shown in FIG. 4b;

B3, growing a $SiO_2$ passivation layer 6 by using a plasma enhanced chemical vapor deposition technology, forming the photoresist mask layer coated with the tackifier in conjunction with the photolithography, the mask layer having openings at a top central area of the current spreading layer 5 and an etched exposed N-GaN layer 21 region exposed by etching the Mesa 10 structure, etching the $SiO_2$ of the top central area and the etched exposed N-GaN layer region by the ICP etching technology for 14 minutes until the $SiO_2$ is completely removed from the regions, and then removing the photoresist by using the acetone and the 85° C. glue removal solution, as shown in FIG. 4c; and B4, preparing a Cr/Al/Ti/Au metal with a thickness of 1.25 µm using a negative photoresist and the electron beam evaporation technology, and preparing the P electrode 8 and the N electrode 7 at an exposed top center area of the current spreading layer 5 and the etched exposed N-GaN layer 21 region exposed by etching the Mesa 10 structure, respectively, i.e., first soaking in the acetone at 60° C. for 10 minutes, followed by metal lift-off using a blue film, as shown in FIG. 4d.

Embodiment 3

Figure 5:
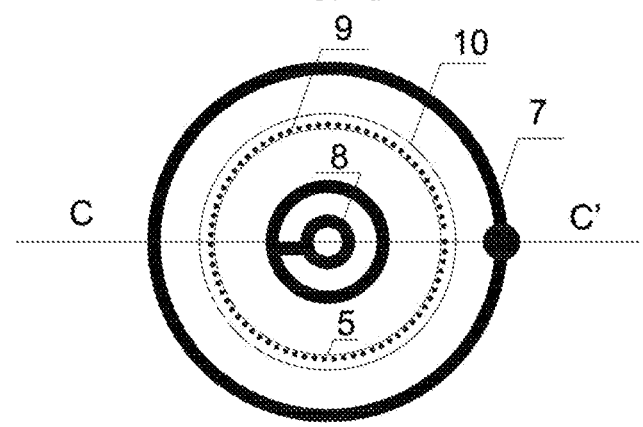
FIG. 5 is a schematic top view of a micro-sized face-up LED device with a micro-hole array in Embodiment 3.

In this embodiment, the micro-holes 9 are distributed only in the middle region between the edge of the current spreading layer 5 and the edge of the Mesa 10, as shown in FIG. 5.

The invention claimed is:

1. A micro-sized face-up LED device with a micro-hole array, wherein the micro-sized face-up LED device with the micro-hole array is prepared based on a GaN-based epitaxial layer material and comprises a GaN-based epitaxial layer, a current spreading layer, a P electrode, an N electrode and a passivation layer, the GaN-based epitaxial layer comprising a substrate, an N-GaN layer, a multiple quantum well layer (MQW), and a P-GaN layer; and the N-GaN layer comprising an etched exposed N-GaN layer and an etched formed N-GaN layer;

wherein an upper surface of the substrate is connected to a lower surface of the etched exposed N-GaN layer; a part of an upper surface of the etched exposed N-GaN layer is connected to the etched formed N-GaN layer and another part of the upper surface of the etched exposed N-GaN layer is connected to the N electrode; an upper surface of the etched formed N-GaN layer is connected to a lower surface of the multiple quantum well layer; an upper surface of the multiple quantum well layer is connected to a lower surface of the P-GaN layer; an upper surface of the P-GaN layer is connected to a lower surface of the current spreading layer, and the current spreading layer is disposed at a center of the upper surface of the P-GaN layer; an upper surface of the current spreading layer is connected to the P electrode, and the P electrode is disposed at a center of the upper surface of the current spreading layer; the passivation layer covers a whole device except the P electrode and the N electrode; the P-GaN layer, the multiple quantum well layer and the etched formed N-GaN layer from top to bottom constitute a Mesa, and the Mesa is prepared with micro-holes in partial regions from an edge of the Mesa to a center direction of the device, wherein the P electrode is in a double ring shape with a straight line connecting two rings in a middle; the current spreading layer has a cylindrical structure with a bottom radius smaller than a bottom radius of the P-GaN layer, and the current spreading layer is a metal doped current spreading layer, including an ohmic contact layer disposed at a bottom of the current spreading layer and forms good ohmic contact with the P-GaN layer and a metal doped current transport layer; the N electrode is annular, an inner ring and an outer ring of the N electrode are round, and an inward and outward semicircular bulge is additionally arranged, and a diameter of the bulge is 5 μm to 15 μm; and the N electrode and the P electrode adopt a four-layer metal alloy composed of metals selected from Ni, Cr, Ti, Ag, Al and Au, with a thickness of 1 μm to 1.25 μm.

2. The micro-sized face-up LED device with the micro-hole array according to claim 1, wherein the Mesa is made from a semiconductor material; the Mesa is a cylindrical structure with a bottom radius of 30 μm to 160 μm; the Mesa is prepared with the micro-holes in the partial regions from the edge of the Mesa to the center direction of the device, the micro-holes are distributed in a circular array on the Mesa, near the edge of the Mesa but not in contact with the edge of the Mesa.

3. The micro-sized face-up LED device with the micro-hole array according to claim 2, wherein the micro-holes are distributed in a middle area between an edge of the current spreading layer and the edge of the Mesa or in the partial regions of the edge of the Mesa to the center direction of the device, including the middle area between the edge of the current spreading layer and the edge of the Mesa and an area extending up to 10 μm toward a center of the current spreading layer.

4. The micro-sized face-up LED device with the micro-hole array according to claim 1, wherein the micro-holes have a shape of one of circle, triangle, square or hexagon; when the micro-holes are circle, the micro-holes have a micron size and a diameter of 1 μm to 8 μm; and when the micro-holes are triangular, square or hexagonal, an inscribed circle diameter of the micro-holes is 1 μm to 8 μm; and depths of the micro-holes are adjustable from 100 nm to 1400 nm; the micro-holes are formed by etching down from a topmost layer of the device, which is one of deep etching to the current spreading layer, etching to the P-GaN layer, etching to the multiple quantum well layer and etching to the N-GaN layer; and the passivation layer is deposited on inner side wall surfaces of the micro-holes.

5. The micro-sized face-up LED device with the micro-hole array according to claim 1, wherein an area covered by the passivation layer comprises the current spreading layer, the P-GaN layer, the multiple quantum well layer, a side wall of the etched formed N-GaN layer, surfaces of the current spreading layer and the etched exposed N-GaN layer, and internal side walls of the micro-holes; the passivation layer is $SiO_2$ and has a thickness of one-quarter optical wavelength to remove a refractive index of a passivation material; the passivation layer is also a $HfO_2$/MgO double-layer passivation layer with a first passivation layer being $HfO_2$ and a second passivation layer being MgO.

6. A method of preparing the micron-sized face-up LED device with the micro-hole array, wherein the micro-sized face-up LED device with the micro-hole array is prepared based on a GaN-based epitaxial layer material and comprises a GaN-based epitaxial layer, a current spreading layer, a P electrode, an N electrode and a passivation layer, the GaN-based epitaxial layer comprising a substrate, an N-GaN layer, a multiple quantum well layer (MQW), and a P-GaN layer; and the N-GaN layer comprising an etched exposed N-GaN layer and an etched formed N-GaN layer;

wherein an upper surface of the substrate is connected to a lower surface of the etched exposed N-GaN layer; a part of an upper surface of the etched exposed N-GaN layer is connected to the etched formed N-GaN layer and another part of the upper surface of the etched exposed N-GaN layer is connected to the N electrode; an upper surface of the etched formed N-GaN layer is connected to a lower surface of the multiple quantum well layer; an upper surface of the multiple quantum well layer is connected to a lower surface of the P-GaN layer; an upper surface of the P-GaN layer is connected to a lower surface of the current spreading layer, and the current spreading layer is disposed at a center of the upper surface of the P-GaN layer; an upper surface of the current spreading layer is connected to the P electrode, and the P electrode is disposed at a center of the upper surface of the current spreading layer; the passivation layer covers a whole device except the P electrode and the N electrode; the P-GaN layer, the multiple quantum well layer and the etched formed N-GaN layer from top to bottom constitute a Mesa, and the Mesa is prepared with micro-holes in partial regions from an edge of the Mesa to a center direction of the device, wherein the method comprises:

S1, evaporating Al-doped indium tin oxide on the GaN-based epitaxial layer by using electron beam evaporation coating technology, performing an annealing treatment by using rapid thermal annealing technology subsequently, and then using a photoresist coated with tackifier as a mask layer, soaking in a current spreading layer etching liquid to form the current spreading layer with a bottom radius smaller than the P-GaN layer and positioned in a central area of a surface of the P-GaN layer, and then removing the photoresist;

S2, forming a photoresist mask layer coated with the tackifier by using a mask with a Mesa structure in combination with photolithography, and transferring the Mesa structure to the GaN-based epitaxial layer by inductively coupled plasma (ICP) etching technology until the etched exposed N-GaN layer is exposed, and then removing the photoresist;

S3, forming the photoresist mask layer coated with the tackifier by using a mask with a micro-hole array structure in conjunction with an ordinary ultraviolet lithography, soaking in the current spreading layer etching liquid, then transferring the micro-hole array structure to the GaN-based epitaxial layer by the ICP etching technology, wherein depths of the micro-holes are adjustable as needed, then baking on a hot plate at 95° C. to 125° C. for 3 minutes to 5 minutes, then soaking in the current spreading layer etching liquid for 1 minute to 5 minutes as a post-treatment of an Al-doped indium tin oxide, and then removing the photoresist;

S4, growing the passivation layer by using a passivation layer deposition technology, forming the photoresist mask layer coated with the tackifier in conjunction with the photolithography, the mask layer having openings at a top central area of the current spreading layer and an etched exposed N-GaN layer region exposed by etching the Mesa structure, etching the top central area of the current spreading layer and the etched exposed N-GaN layer region exposed by etching the Mesa structure by the ICP etching technology until the passivation layer is completely removed, and then removing the photoresist; and S5. preparing a metal using a negative photoresist and electron beam evaporation technology, and preparing the P electrode and the N electrode at an exposed top center area of the current spreading layer and the etched exposed N-GaN layer region exposed by etching the Mesa structure, respectively, in conjunction with a metal lift-off technology, wherein the P electrode is in a double ring shape with a straight line connecting two rings in a middle; the current spreading layer has a cylindrical structure with a bottom radius smaller than a bottom radius of the P-GaN layer, and the current spreading layer is a metal doped current spreading layer, including an ohmic contact layer disposed at a bottom of the current spreading layer and forms good ohmic contact with the P-GaN layer and a metal doped current transport layer; the N electrode is annular, an inner ring and an outer ring of the N electrode are round, and an inward and outward semicircular bulge is additionally arranged, and a diameter of the bulge is 5 µm to 15 µm; and the N electrode and the P electrode adopt a four-layer metal alloy composed of metals selected from Ni, Cr, Ti, Ag, Al and Au, with a thickness of 1 µm to 1.25 µm.

7. The method of preparing the micro-sized face-up LED device with the micro-hole array according to claim 6, wherein step S1 comprises:

S1.1, using the electron beam evaporation technology to evaporate an ITO layer used as the ohmic contact layer at 25° C. to 35° C. under a vacuum condition without oxygen; then introducing 2 sccm to 6 sccm oxygen continuously, and evaporating an ITO layer used as an Al-doped current transport layer, a ratio of the ITO layer used as the ohmic contact layer and the ITO layer used as the Al-doped current transport layer being 1:5 to 1:10, and a total thickness of the ITO layers being 100 nm to 230 nm;

S1.2, according to step S1.1, stopping introducing oxygen and continuing an evaporation of Al metal under a vacuum atmosphere, the Al metal having a thickness of 1 nm to 5 nm; and S1.3, taking out samples in an electron beam evaporation equipment after steps S1.1 and S1.2, and performing annealing treatment in a rapid thermal annealing furnace; forming an Al-doped ITO current spreading film after the annealing treatment was completed, with a bottom layer as the ITO layer of the ohmic contact layer and a top layer as the ITO layer of the Al-doped current transport layer.

8. The method of preparing the micro-sized face-up LED device with the micro-hole array according to claim 6, wherein in step S3, the micro-holes on the mask with the micro-hole array structure are distributed in a middle area between an edge of the current spreading layer and the edge of the Mesa or in the partial regions of the edge of the Mesa to the center direction of the device, including the middle area between the edge of the current spreading layer and the edge of the Mesa and an area extending up to 10 µm toward a center of the current spreading layer; the micro-holes have a shape of one of a circle, a triangle, a square or a hexagon; when the micro-holes are circle, the micro-holes have a micron size; and when the micro-holes are triangular, square or hexagonal, an inscribed circle diameter of the micro-holes is micron; and depths of the micro-holes are adjustable as needed from 100 nm to 1400 nm; the micro-holes are formed by etching down from a topmost layer of the device, which is one of deep etching to the current spreading layer, etching to the P-GaN layer, etching to the multiple quantum well layer and etching to the N-GaN layer;

the mask with the micro-hole array structure can be replaced by a mask with a nano-hole array structure, and the corresponding ordinary ultraviolet lithography needs to be replaced by electron beam lithography; the nano-hole is round and has a diameter of 50 nm to 1000 nm; the nano-hole is distributed in the middle area between the edge of the current spreading layer and the edge of the Mesa or in the partial regions of the edge of the Mesa to the center direction of the device, including the middle area between the edge of the current spreading layer and the edge of the Mesa and an area extending up to 10 µm toward the center of the current spreading layer; a depth of the nano-hole is adjustable as needed from 100 nm to 1400 nm, which is formed by etching down from the topmost layer of the device, and is one of deep etching to the current spreading layer, etching to the P-GaN layer, etching to the multiple quantum well layer and etching to the N-GaN layer.

9. The method of preparing the micron-sized face-up LED device with the micro-hole array according to claim 6, wherein the step S2 and the step S3 can be combined, and the mask with the Mesa structure in step S2 and the mask with the micro-hole array structure in step S3 can be replaced by a mask with both the Mesa structure and the micro-hole array structure, and a specific operation is as follows:

forming the photoresist mask layer coated with the tackifier by using the mask with both the Mesa structure and the micro-hole array structure in conjunction with the ordinary ultraviolet lithography, soaking in the current spreading layer etching liquid, then transferring the Mesa structure and the micro-hole array structure to the GaN-based epitaxial layer by the ICP etching technology until the etched exposed N-GaN layer is exposed, and a height of the micro-hole being the same as a height of the Mesa, then baking on the hot plate at 95° C. to 125° C. for 3 minutes to 5 minutes, then soaking in the current spreading layer etching liquid for 1 minute to 5 minutes as the post-treatment of the Al-doped indium tin oxide, and then removing the photoresist.

* * * * *